US008058931B1

(12) United States Patent
Zhou

(10) Patent No.: US 8,058,931 B1
(45) Date of Patent: Nov. 15, 2011

(54) ENHANCING AN OPERATIONAL AMPLIFIER'S CAPACITIVE LOAD DRIVING CAPABILITY USING PARALLEL MILLER FEEDBACK

(75) Inventor: Ping Zhou, Plano, TX (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/768,245

(22) Filed: Apr. 27, 2010

Related U.S. Application Data

(60) Provisional application No. 61/264,149, filed on Nov. 24, 2009.

(51) Int. Cl.
*H03F 1/14* (2006.01)
(52) U.S. Cl. ............ 330/292; 330/310; 330/99; 330/98
(58) Field of Classification Search .................. 330/292, 330/310, 98, 99
See application file for complete search history.

(56) References Cited

U.S. PATENT DOCUMENTS

| | | | | |
|---|---|---|---|---|
| 4,531,106 A * | 7/1985 | Ganesan | ........................ | 333/173 |
| 6,208,206 B1 * | 3/2001 | Leung et al. | ................... | 330/107 |
| 6,407,636 B1 * | 6/2002 | Goutti | ........................... | 330/255 |
| 7,292,098 B2 * | 11/2007 | Chen et al. | ...................... | 330/109 |
| 7,639,073 B2 * | 12/2009 | Deng et al. | ......................... | 330/9 |
| 7,808,311 B2 * | 10/2010 | Sutardja | ........................... | 330/98 |
| 7,852,158 B2 * | 12/2010 | Kobayashi et al. | ........... | 330/260 |
| 7,880,545 B1 * | 2/2011 | Venca et al. | .................. | 330/292 |

* cited by examiner

*Primary Examiner* — Patricia Nguyen
(74) *Attorney, Agent, or Firm* — McDermott Will & Emery LLP

(57) ABSTRACT

An apparatus for an improved operational amplifier. The disclosed improved operational amplifier comprises an operational amplifier, a first feedback circuit, and one or more secondary feedback circuits. The operational amplifier include a plurality of serially coupled gain stages and is configured so that an output of each gain stage drives an input of a next gain stage and an output of a last gain stage drives a load external to the improved operational amplifier. The first feedback circuit is coupled between an output of a designated gain stage and an output of a previous gain stage to provide a first feedback to the previous gain stage. Each secondary feedback circuit provides an additional feedback to the output of the previous gain stage.

15 Claims, 5 Drawing Sheets

ENHANCING AN OPERATIONAL AMPLIFIER'S CAPACITIVE LOAD DRIVING CAPABILITY USING PARALLEL MILLER FEEDBACK

RELATED APPLICATION

The present invention claims priority of provisional patent application No. 61/264,149 filed Nov. 24, 2009, the contents of which are incorporated herein in their entirety.

BACKGROUND

1. Technical Field

The present teaching relates to method and system for analog circuits. More specifically, the present teaching relates to method and system for operational amplifiers and systems incorporating the same.

2. Discussion of Technical Background

Operational amplifiers (op-amp) are widely used to drive a load which often corresponds to a capacitive load. A typical op-amp with a Miller feedback is shown as 100 in FIG. 1 (Prior Art). Circuit 100 includes two gain stages 115 and 125 in series (the output of the first gain stage drives the input of the second gain stage) and a Miller feedback element 150. The first gain stage 115 comprises a gm stage (110) with parasitic loads (120 and 121). The first gain stage has a positive voltage gain at zero frequency (DC). A gm stage is a functional block where the output current is a function (normally a linear function) of input voltage difference. The second gain stage 125 comprises a gm stage (130) with an external load (104). The Miller feedback 150 is a capacitive element 160 (sometimes in series with a resistive element 155) from the output of the second gain stage to the output of the first gain stage. The second gain stage 125 has a negative voltage gain at zero frequency (DC).

Specifically, the first gain stage has its positive input connected to the op-amp positive input (180) and its negative input connected to the op-amp negative input (190). At the output of gain stage 115 (VA), a resistor 120 and a capacitor 121 represent the load at that node (including parasitic and next stage load). The second gain stage 125 has its input connected to the first gain stage output (VA). The Miller feedback circuit (150) connects VOUT which is the output of the second gain stage (125) and VA which is the output of the first gain stage (115). Alternatively, the input of the second gain stage (125) may be generated by a buffer (not shown) situated between the output of first gain stage 115 and the input of second gain stage 125.

At the second gain stage, the output of amplifier (VOUT) is connected to the external load (represented by load resistor 135 and a load capacitor 140, which are connected in parallel). The output of the amplifier (VOUT) is also fed back to node VA through the Miller feedback element 150. The Miller feedback element 150 comprises a serially connected resistor 155 and a capacitor 160.

To drive a larger capacitive load, traditionally, a resistor 170 is introduced which is connected in series, with the load capacitor. However, this solution may cause voltage swing problem with degradation of gain bandwidth product and slew rate depending on the load. Therefore, there is a need for an operational amplifier that can drive a larger capacitive load but avoid voltage swing problem while maintaining a good slew rate and a good gain bandwidth product.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present invention discloses a method for an improved operational amplifier which can be used to drive a larger capacitive load without a series isolation resistor while maintaining good slew rate and gain bandwidth product.

Figure 1:
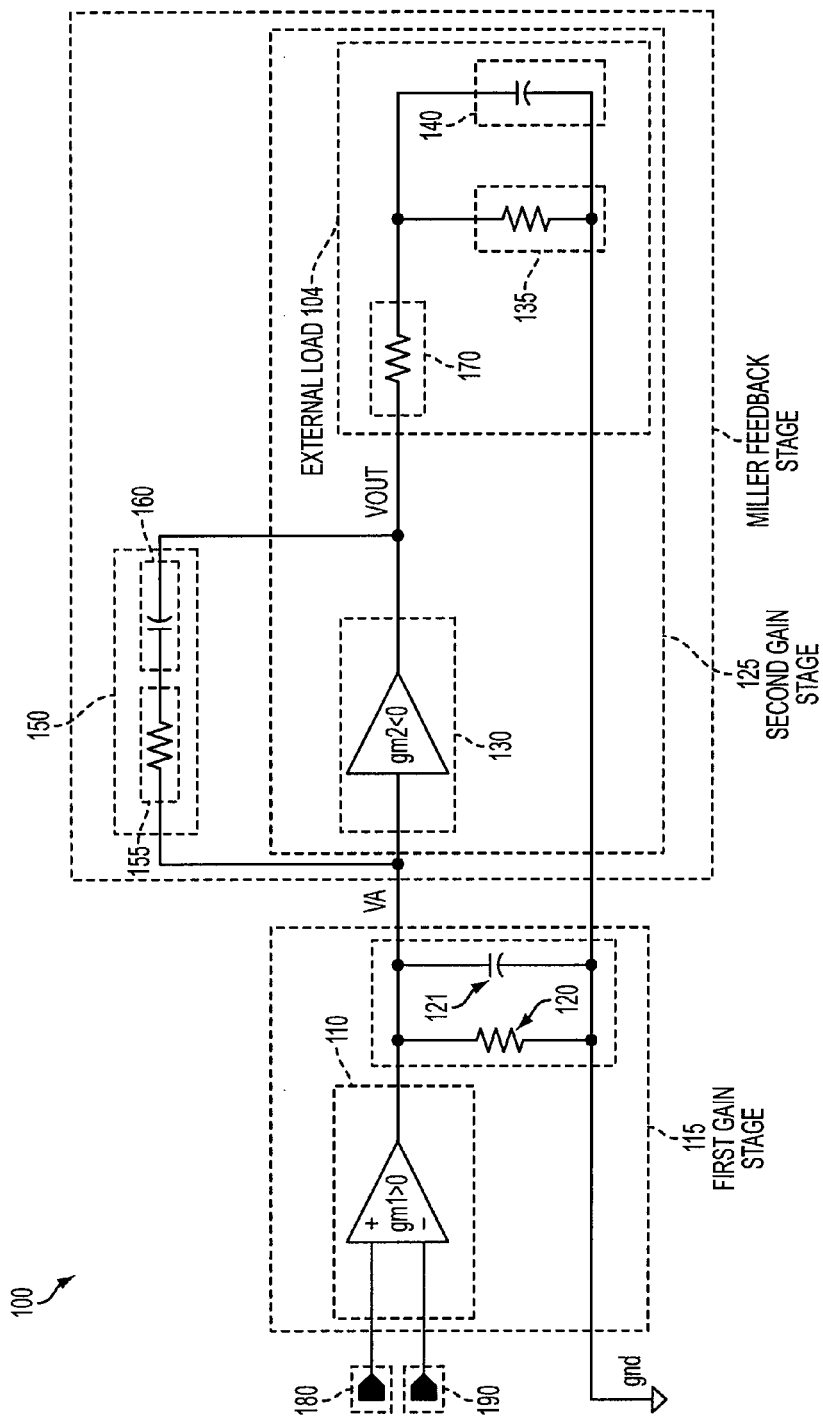
FIG. 1 (Prior Art) illustrates a conventional two stage operational amplifier.
Figure 2:
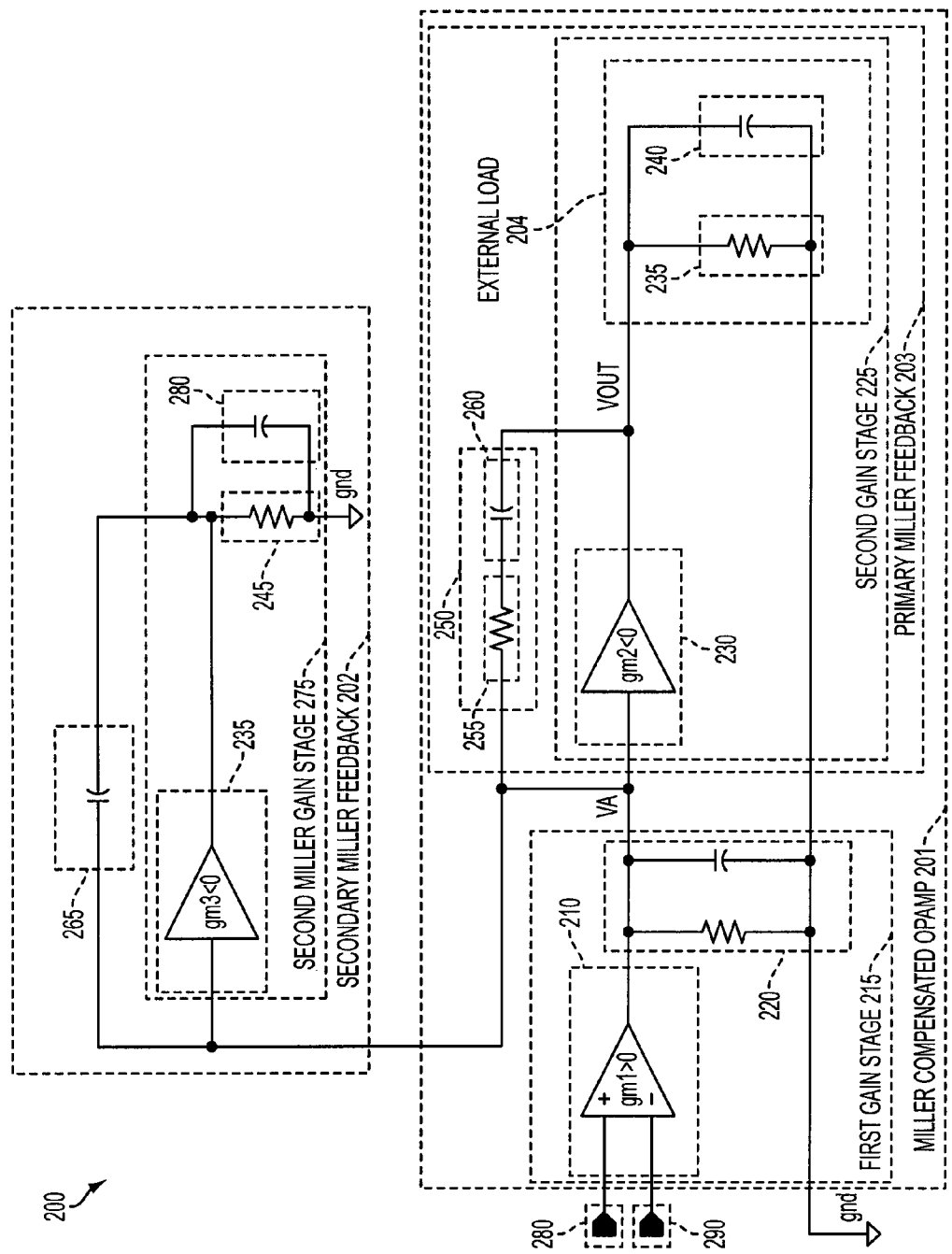
FIG. 2 depicts an exemplary circuit for an improved operational amplifier, according to an embodiment of the present invention.

FIG. 2 depicts an exemplary op-amp circuit 200 with parallel Miller feedback for improved ability to drive a larger capacitive load, according to an embodiment of the present teaching. The circuit 200 comprises a Miller compensated operational amplifier 201 and a secondary Miller feedback circuit 202. The Miller compensated op-amp 201 is constructed similarly as a traditional Miller compensated op-amp as shown in FIG. 1. Specifically, the Miller compensated op-amp 201 includes two gain stages 215 and 225 in series (the output of the first gain stage 215 drives the input of the second gain stage 225) and a Miller feedback element 250. The second gain stage 225 and a first Miller feedback circuit 250 form a primary Miller feedback circuit 203.

The secondary Miller feedback circuit 202 comprises a gain stage 275 (gm stage 235 and an internal load 245) and a Miller feedback element (265). The input of the secondary Miller feedback stage is the same as the primary Miller feedback 203 and the feedback is from the output of the gain stage 275 to the output of the first gain stage 215 of the op-amp. The secondary Miller feedback is in parallel to the primary Miller feedback 203.

As discussed previously, the DC voltage gain of the first gain stage 215 is normally high because of the high parasitic resistance of circuit 220. The DC voltage gain of the second gain stage 225 depends on the external load resistance 235. When the load capacitance 240 is large and load resistance 235 is high, the effective gain of the second stage is high at low frequencies and low at high frequencies. This is because the effective load impedance is low at high frequencies. The secondary Miller feedback gain stage 275 is designed to have a DC voltage gain much less than the DC gain of the second gain stage 225. Resistor 245 is designed to make the secondary Miller feedback gain stage 275 have a certain DC gain.

The gm of the gain stage 235 of the secondary Miller feedback circuit 202 can be much less than that (230) of the second gain stage 225, which makes it consume little current compared to the second gain stage 225 in the primary Miller feedback circuit 203. The capacitance of the Miller feedback element 265 of the secondary Miller feedback circuit 202 can be designed to have a value comparable to that of capacitor 260 in the primary Miller feedback circuit 203. The secondary Miller feedback circuit 202 may also have a residual capacitor 280 with a small capacitance.

In operation, because the DC gain of the secondary Miller feedback circuit 202 is low compared to that of the second gain stage 225 of the primary Miller feedback circuit 203, the gain bandwidth and slew rate is not noticeably affected by the addition of the secondary Miller feedback circuit 202. Thus, the added secondary Miller feedback circuit does not affect the operational amplifier at lower frequencies. That is, the secondary Miller feedback circuit 202 is only effective at high frequencies when the AC gain of the second gain stage (225) is higher than the AC gain of the secondary Miller feedback circuit 202. When there is a high capacitive load, the secondary Miller feedback circuit 202 is effective at higher frequencies due to the relatively lower effective gain of the second stage in the primary Miller feedback circuit 203 when compared to the secondary Miller feedback circuit 202. The underlying effect of having two Miller feedback circuits is that the second Miller compensation is to split the non-dominant pole of the operational amplifier with its own pole and insert a zero to stabilize the operational amplifier.

As discussed herein, the addition of the secondary Miller feedback circuit 202 does not affect the performance of the operational amplifier at lower frequencies. The added secondary Miller feedback circuit 202 compensates for the degradation of the primary Miller feedback circuit at higher frequencies. Thus, the primary and the secondary Miller feedback circuits play roles in different ranges of frequencies so that, in combination, the improved operational amplifier 200 provides a better performance across a wider range of frequencies without having a noticeable impact on its slew rate and gain bandwidth product. In addition, since the secondary Miller feedback circuit 202 consumes much lower current as compared with the primary Miller feedback circuit 203 and has few additional components, the cost of adding the secondary Miller feedback circuit 202 is negligible.

As illustrated in FIG. 2, the output of the first gain stage 215 and the feedback from both the primary and secondary Miller feedback circuits 203 and 202 are connected together at VA. There is no buffering between the first gain stage 215 and the second gain stage 225. In practice, an implementation may include a buffer between the first gain stage 215 and the second gain stage 225. In such implementations, a buffer can be deployed between the first gain stage 215 and the second gain stage 225 with the feedbacks from the primary and secondary Miller feedback circuits (203 and 202) being connected to the output of the first gain stage.

Figure 3:
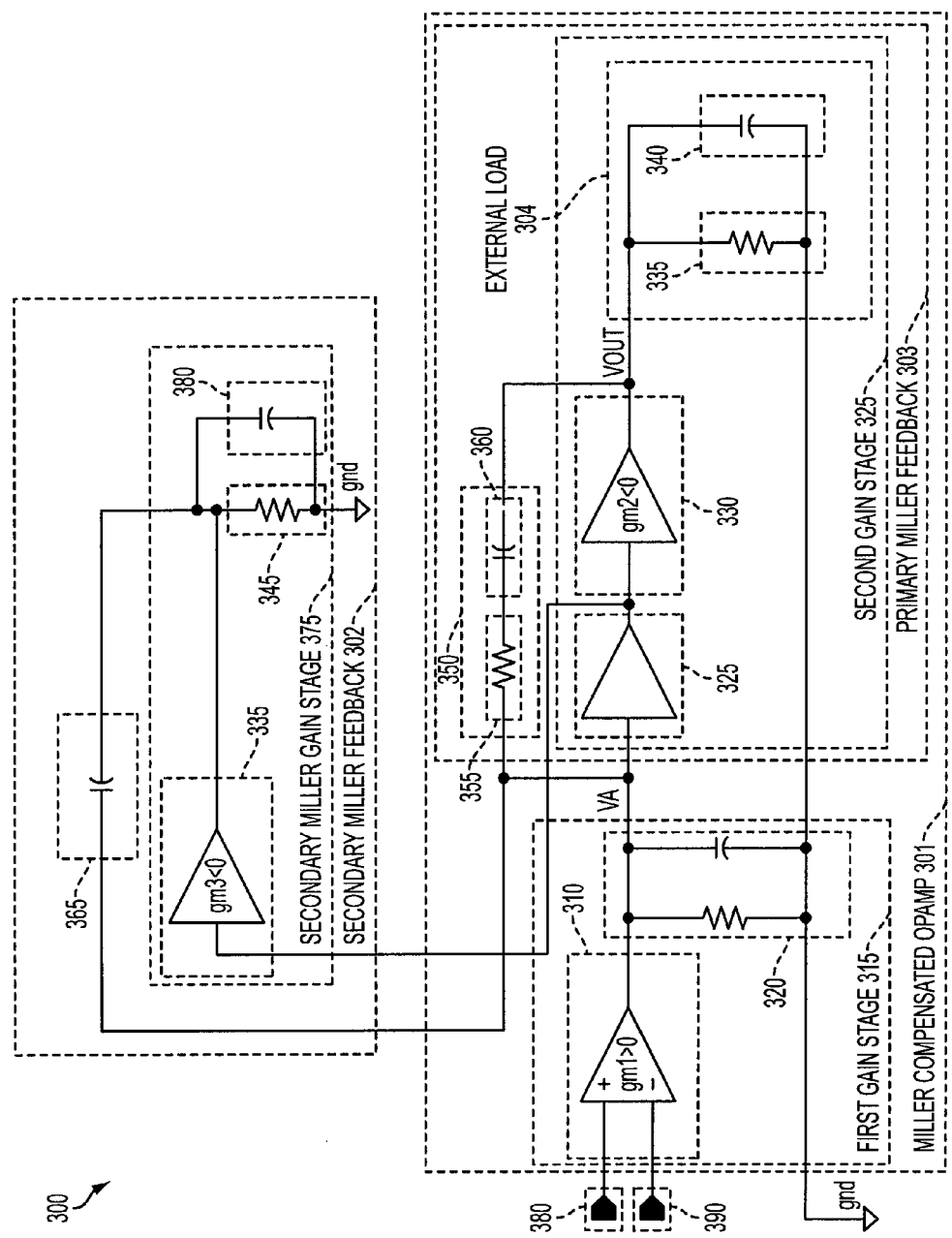
FIG. 3 depicts a different exemplary circuit for an improved operational amplifier, according to an embodiment of the present invention.

FIG. 3 depicts a different exemplary circuit 300 for an improved operational amplifier, according to an embodiment of the present teaching. Circuit 300 is constructed similar to circuit 200, comprising a traditional operational amplifier 301, and a secondary Miller feedback circuit 302. The difference between circuit 200 and circuit 300 is the addition of a buffer 325, which is inserted between the output of the first gain stage and input of the second gain stage. However, it is understood that such a buffer is not topologically necessary in realizing an improved operational amplifier as disclosed herein. In addition, although the exemplary circuits as illustrated in FIGS. 2 and 3 are two-stage Miller compensated with two feedback circuits, the present teaching should not be limited to what is illustrated herein. As a person skilled in the art would appreciate, the present teaching is also applicable to an operational amplifier with multiple stages and multiple feedbacks.

Figure 4:
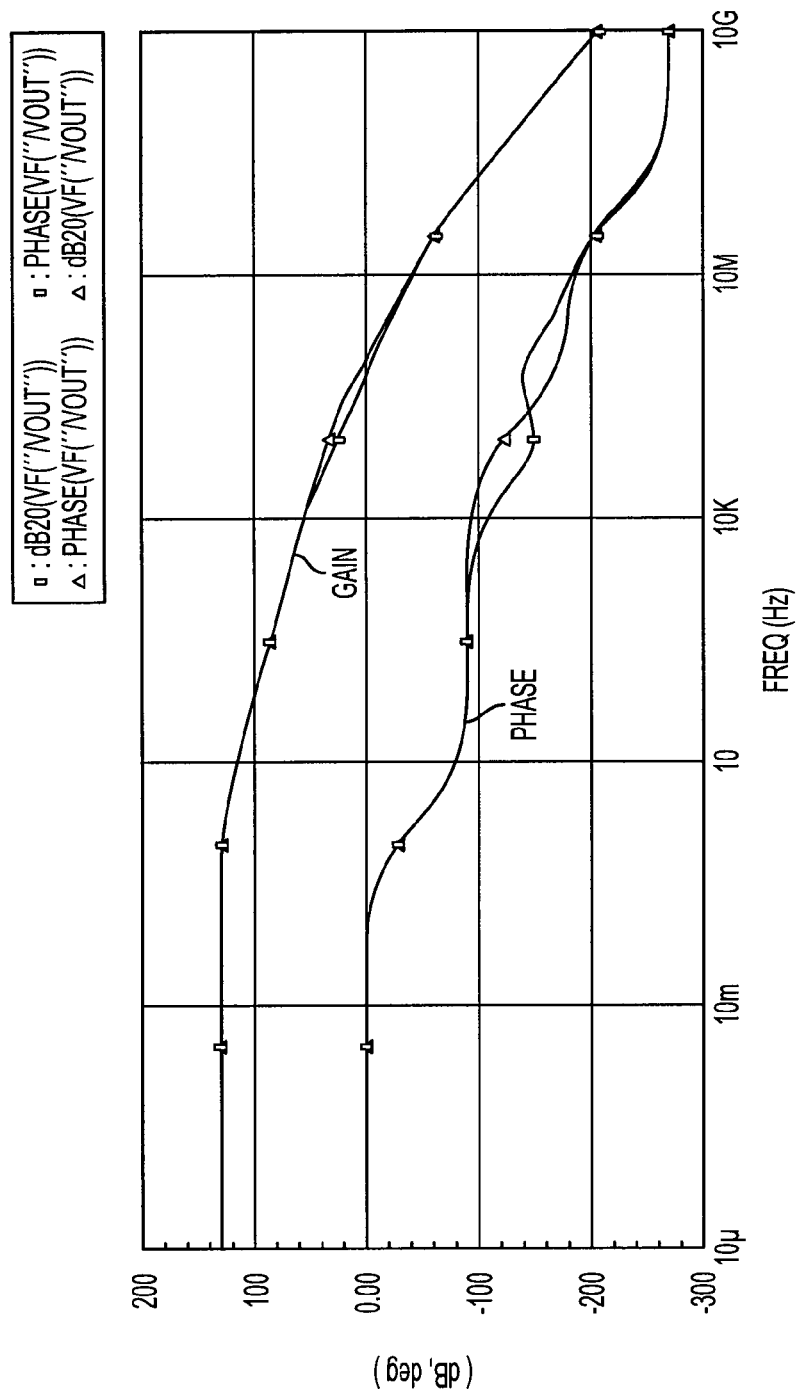
FIG. 4 shows plots comparing the gain and phase observed at the output of an operational amplifier with or without the improvement in accordance with the present invention.

FIG. 4 shows plots of the gain and phase observed at the output of an operational amplifier with or without the parallel Miller feedback improvement. Specifically, the plots represent the observed gain and phase at VOUT with and without the improvements as described herein. In FIG. 4, the X-axis represents frequency and Y-axis represents gain (in dB) or phase (in degrees). There are two groups of plotted curves. The top group having two curves represents the gains observed at VOUT, with and without the secondary Miller feedback circuit, respectively. Similarly, the bottom group of two curves represents the observed phase values observed at VOUT, with and without the secondary Miller feedback circuit, respectively. Within each group, the curve with rectangles is plotted based on observations made from a circuit with a secondary Miller feedback circuit. The curve with triangles is plotted based on observations made from a circuit without the secondary Miller feedback circuit.

As can be seen from the four curves shown in FIG. 4, at frequencies lower than 1 kHz, the curves are almost identical with or without the parallel Miller feedback implementation. This evidences that the addition of the parallel Miller feedback circuit has no visible impact to the operational amplifier at lower frequencies. It can also be seen that in the frequency range between 1 kHz and 10 MHz, the performances of operational amplifiers with and without the parallel Miller feedback circuit differ. Specifically, the gain observed at VOUT is higher without the parallel Miller feedback implementation and lower with the parallel Miller feedback implementation. As to the phase, the phase value of the op-amp with parallel feedback implementation is higher than the phase value observed from the op-amp without parallel feedback implementation at the 0 dB gain points. So the op-amp with parallel Miller implementation is more stable than the one without. For the parameters in the example, it can be observed that with the parallel Miller feedback implementation, the phase margin is improved from 8 to 41, and the gain margin is improved from 22 to 38.

Figure 5:
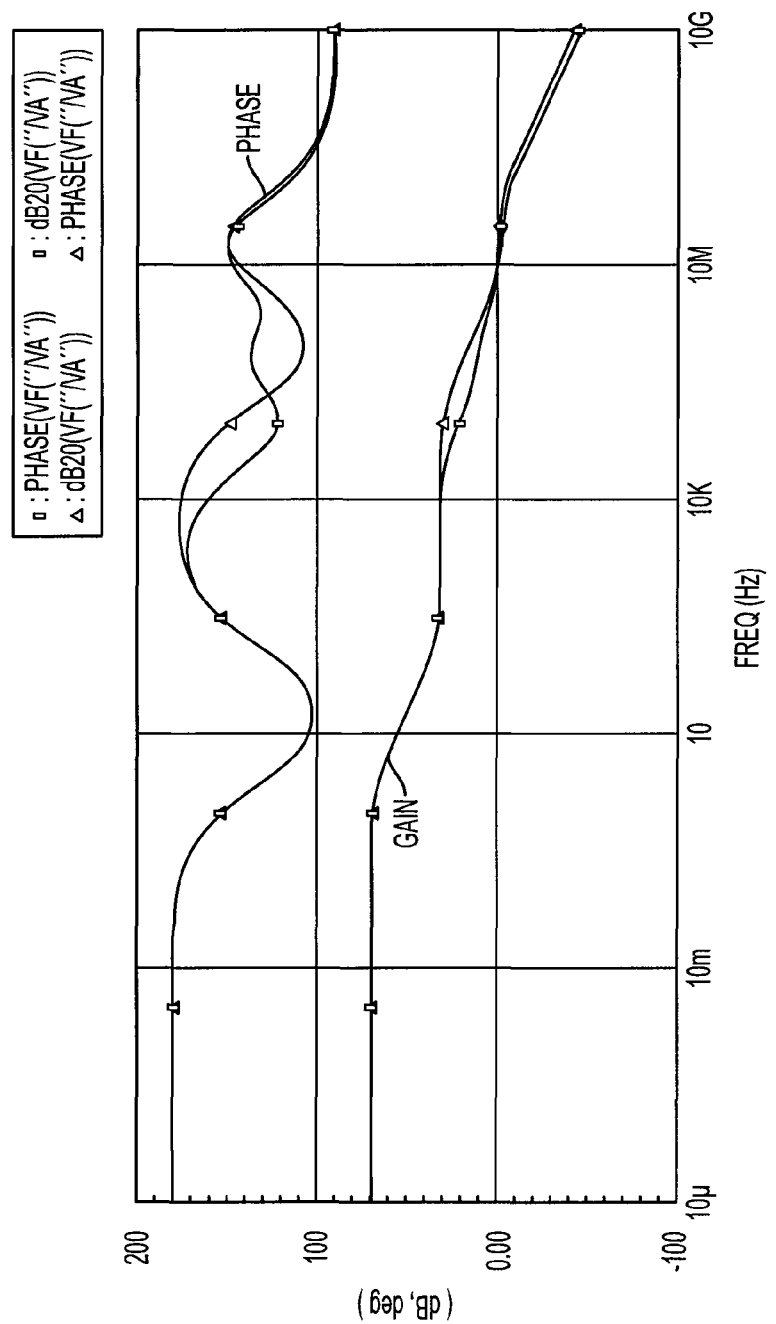
FIG. 5 shows plots comparing the gain and phase observed at a feedback point (VA) of an operational amplifier with or without the improvement in accordance with the present invention.

FIG. 5 shows plots comparing the gain and phase observed at the feedback point VA of op-amps with or without the parallel Miller feedback improvement. The curves are plotted based on similar observations as those in FIG. 4 except that the observations here are made at VA rather than at VOUT. The top group has two curves representing the phase observed at VA with and without the parallel Miller feedback circuit, respectively. Similarly, the bottom group of two curves represents the observed gain values at VA with and without the parallel Miller feedback circuit, respectively. Within each group, the curve with rectangles is plotted based on observations made from a circuit with the parallel Miller feedback implementation. The curve with triangles is plotted based on observations made from a circuit without the parallel Miller feedback implementation. The plot representing the phase values from a circuit with parallel Miller feedback implementation clearly demonstrates the additional pole-zero split.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A circuit for improved capacitive driving capability of an operational amplifier, comprising:
   an operational amplifier, comprising a plurality of serially coupled gain stages, configured so that an output of each gain stage drives an input of a next stage and an output of last gain stage drives a load external to the circuit;
   a first feedback circuit, coupled between an output of a designated gain stage and an output of a previous gain stage to provide a first feedback to the previous gain stage; and
   one or more secondary feedback circuits, each of which provides an additional feedback to the output of the previous gain stage,
   wherein each of the one or more secondary feedback circuits includes a gain stage and a feedback sub-circuit.

2. The circuit of claim 1, wherein the serially connected gain stages include a first gain stage connected to inputs of the operational amplifier.

3. The circuit of claim 1, wherein an output of a last gain stage connects to the output of operational amplifier having an external load.

4. The circuit of claim 1, wherein each of the gain stages comprises a first amplifier with a load at the output of the gain stage.

5. The circuit of claim 4, wherein the load at the output of a gain stage is the input load of a next gain stage.

6. The circuit of claim 1, further comprising a buffer connecting between an input of a gain stage and an output of a previous gain stage.

7. The circuit of claim 6, wherein the buffer corresponds to a unit gain buffer.

8. The circuit of claim 1, wherein the first feedback circuit comprises:
   a first capacitor; and
   a first resistor serially connected to the first capacitor, wherein
   the serially connected first capacitor and resistor are coupled between the output of the designated gain stage and the output of the previous gain stage.

9. The circuit of claim 8, wherein
   the first capacitor has its first terminal connected to the output of the designated gain state; and
   the first resistor has its first terminal connected to second terminal of the first capacitor and its second terminal connected to the output of the previous gain stage.

10. The circuit of claim 8, wherein
    the first resistor has its first terminal connected to the output of the designated gain state; and
    the first capacitor has its first terminal connected to second terminal of the first resistor and its second terminal connected to the output of the previous gain stage.

11. The circuit of claim 1, wherein the gain stage in each secondary feedback circuit comprises:
    a second amplifier having its input coupled to the output of the previous gain stage; and
    a second resistor connecting between an output of the second amplifier and the ground.

12. The circuit of claim 1, wherein the feedback sub-circuit in each secondary feedback circuit comprises a second capacitor having its first terminal coupled to the output of the gain stage of the secondary feedback circuit and second terminal connected to the output of the previous gain stage.

13. An apparatus having a system load driven by an improved operational amplifier, comprising:
    a system circuit configured for performing one or more functions;
    an improved operational amplifier coupled with the system circuit and configured for driving the system circuit, wherein the improved operational amplifier provides improved capacitive driving capability and comprises:
    an operational amplifier, comprising a plurality of serially coupled gain stages, configured so that an output of each gain stage drives an input of a next gain stage and an output of a last gain stage drives a load external to the improved operational amplifier;
    a first feedback circuit, coupled between an output of a designated gain stage and an output of a previous gain stage to provide a first feedback to the previous gain stage; and
    one or more secondary feedback circuits, each of which provides an additional feedback to the output of the previous gain stage,
    wherein each of the one or more secondary feedback circuits includes a gain stage and a feedback sub-circuit.

14. A circuit for improved capacitive driving capability of an operational amplifier, comprising:
    an operational amplifier, comprising a plurality of serially coupled gain stages, configured so that an output of each gain stage drives an input of a next stage and an output of last gain stage drives a load external to the circuit;
    a first feedback circuit, coupled between an output of a designated gain stage and an output of a previous gain stage to provide a first feedback to the previous gain stage;
    one or more secondary feedback circuits, each of which provides an additional feedback to the output of the previous gain stage, and
    a buffer connecting between an input of a gain stage and an output of a previous gain stage.

15. The circuit of claim 14, wherein the buffer corresponds to a unit gain buffer.

* * * * *